United States Patent
Huber-Lenk et al.

(10) Patent No.: US 6,912,476 B2
(45) Date of Patent: Jun. 28, 2005

(54) POSITION MEASURING DEVICE AND METHOD FOR DETERMINING A POSITION

(75) Inventors: Herbert Huber-Lenk, Nussdorf/Sondermoning (DE); Jörg Drescher, Riedering (DE); Mathias Hausschmid, Palling (DE); Herbert Reiter, Garching/Alz (DE); Johann Streitwieser, Grabenstätt (DE); Wolfgang Holzapfel, Obing (DE)

(73) Assignee: Johannas Heidenham GmbH, Traunreut (DE)

( * ) Notice: Subject to any disclaimer, the term of this patent is extended or adjusted under 35 U.S.C. 154(b) by 0 days.

(21) Appl. No.: 10/415,290

(22) PCT Filed: Sep. 15, 2001

(86) PCT No.: PCT/EP01/10682
§ 371 (c)(1),
(2), (4) Date: Aug. 1, 2003

(87) PCT Pub. No.: WO02/39066
PCT Pub. Date: May 16, 2002

(65) Prior Publication Data
US 2004/0006443 A1 Jan. 8, 2004

(30) Foreign Application Priority Data
Oct. 31, 2000 (DE) .......................................... 100 54 070

(51) Int. Cl.⁷ .............................................. G06F 15/00
(52) U.S. Cl. ..................................................... 702/150
(58) Field of Search .............................. 702/94, 95, 97, 702/150–153, 155, 158; 324/326, 327, 329

(56) References Cited

U.S. PATENT DOCUMENTS

| 5,391,970 A | 2/1995 | Chaffee et al. ............. 318/618 |
| 6,525,538 B1 * | 2/2003 | Mercer ........................ 324/326 |

FOREIGN PATENT DOCUMENTS

JP  5-226232 A  9/1993

OTHER PUBLICATIONS

Patent Abstracts of Japan document regarding Japanese publication 5,226232 A, published by Japanese Patent Office, Dec. 10, 1993, one page.

* cited by examiner

Primary Examiner—Michael Nghiem
(74) Attorney, Agent, or Firm—Brinks Hofer Gilson & Lione

(57) ABSTRACT

A method for position determination in a position measuring device that includes digitizing analog position data from a detector unit within time intervals of an internal clock rate and calculating position data from the digitized data. Determining a period of time $\Delta t$ between a pulse of the internal clock until an appearance of an external trigger signal and a processing of at least two position data, together with the period of time $\Delta t$.

8 Claims, 2 Drawing Sheets

POSITION MEASURING DEVICE AND METHOD FOR DETERMINING A POSITION

Applicants claim, under 35 U.S.C. §§ 120 and 365, the benefit of priority of the filing date of Sep. 15, 2001 of a Patent Cooperation Treaty patent application, copy attached, Serial Number PCT/EP01/10682, filed on the aforementioned date, the entire contents of which are incorporated herein by reference, wherein Patent Cooperation Treaty patent application Serial Number PCT/EP01/10682 was not published under PCT Article 21(2) in English.

Applicants claim, under 35 U.S.C. § 119, the benefit of priority of the filing date of Oct. 31, 2000 of a German patent application, copy attached, Ser. No. 100 54 070.8, filed on the aforementioned date, the entire contents of which are incorporated herein by reference.

BACKGROUND OF THE INVENTION

1. Field of the Invention

The present invention relates to a position measuring device, in particular for employment in connection with a lithographic system. The present invention moreover relates to a method for position determination in a position measuring device.

2. Description of the Related Art

It must be possible by a position measuring device in a lithographic system to determine the position of a movable object in such a way that the time of the measurement, as well as the position of the movable object are very precisely fixed. A lithographic system operating in accordance with the scanner principle moves a wafer table and a photo-masking table, for example, in relation to each other, and in the process exposes only a portion of the area to the photo-mask to be represented on a wafer. Spatial or chronological errors in positioning, and therefore in position determination, result in overlay errors of the structures to be represented with respect to structures already present on the wafer.

In such a lithographic system a central control requests a positional value from a position measuring device at fixed times (for example every 50 $\mu$s), which then must output the position of the movable object (for example the mask table) at the time of the position value request as the response. Because of the high displacement speeds customary today (approximately 2 m/s for the mask table), an inaccuracy of one nanosecond in the chronological determination of the positional value then means an error of two nanometers in the position determination, which approximately corresponds to the demands made on such a position measuring device.

SUMMARY AND OBJECTS OF THE INVENTION

It is therefore an object of the present invention to disclose a position measuring device which can determine the position of a movable object at a time fixed by an exterior source and thereafter can output it.

This object is attained by a position measuring device for determining a position of a movable object that includes a detector unit and an A/D converter connected to the detector unit, the A/D converter is controlled by an internal clock. A processing unit connected to the A/D converter, an extrapolation unit connected to the processing unit and a timer connected to the extrapolation unit and the internal clock, the timer detects a period of time $\Delta t$ between a pulse of the internal clock and an external trigger signal.

It is a further object of the present invention to disclose a method which permits the extremely accurate determination of the position of a movable object at the time a position request is made, and subsequently to make this available for further processing.

This object is attained by a method for position determination in a position measuring device that includes digitizing analog position data from a detector unit within time intervals of an internal clock rate and calculating position data from the digitized data. Determining a period of time $\Delta t$ between a pulse of said internal clock until an appearance of an external trigger signal and a processing of at least two position data, together with the period of time $\Delta t$.

The principle of the present invention is based on determining the position of the movable object at intervals which are predetermined by an internal clock device of the position measuring device, to determine the chronological distance of a trigger signal from the last position measurement when a position request (trigger signal) arrives from a control unit, and to extrapolate a positional value at the time of the arrival of the trigger signal from at least two previously measured positional values. This extrapolated positional value is then output as the response to the position request.

Further advantages, as well as details of the present invention ensue from the following description of a preferred embodiment by the drawings. Shown are in:

DESCRIPTION OF THE PREFERRED EMBODIMENT(S) OF THE INVENTION

Figure 1:
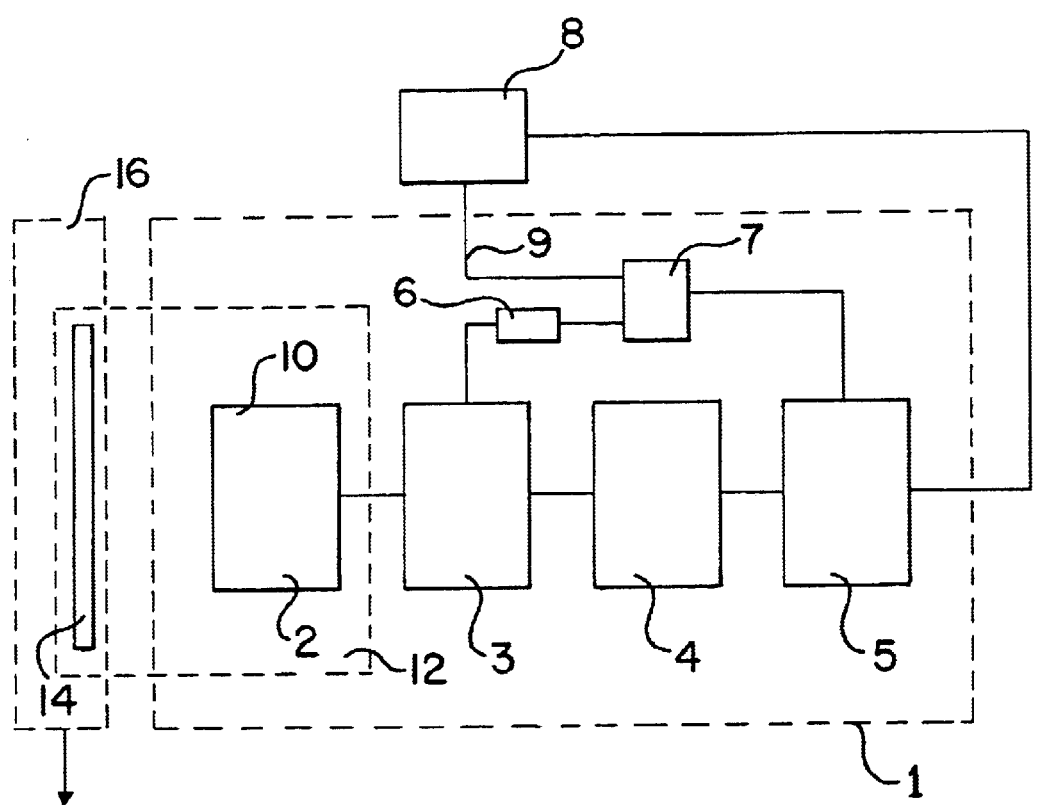
FIG. 1 schematically shows an embodiment of a position measuring device in accordance with the present invention.

FIG. 1 shows a position measuring device 1, whose components and their functions will be explained in what follows. Analog signals corresponding to the physical measuring principle used are generated in a detector unit 2, which can be a scanning head 10 of an optical grating measuring system 12. These can be, for example, signals from a photo-detector, which receives modulated light from the scanning of an optical grating measuring system 12 with an incremental graduation 14 and reference pulses. As schematically shown in FIG. 1, the optical grating measuring system 12 is associated with an object 16, whose position is to be determined in accordance with the present invention. Possible embodiments for the optical grating measuring system 12 are well known in the art. The use of optical measuring principles suggests itself because of the high resolution required in the above mentioned case of application (it would also be possible to detect signals from an interferometer in the detector unit 2), but in principle other measuring methods are also possible, based on magnetic, inductive or capacitive effects, which scan linear, as well as rotary movements. In the case of application described, the detector unit 2 detects the linear movement of a mask table associated with the moving object 16 (see arrow representing linear movement).

The analog signals from the detector unit 2 are conducted to an A/D converter 3. The latter digitizes the analog signals respectively at times t preset by an internal clock 6 of 1 MHz at intervals of 1 μs and passes the digitized values on to a processing unit 4, in which a positional value is calculated from them. The position measurement at this fast rate is necessary in order to make possible the counting of the increments in an incremental measuring system. It is also possible to perform corrections, for example of the phase position of the individual digital signals in the processing unit 4, the resolution of the position determination can also be increased by interpolation. An absolute position determination can be performed by the evaluation of reference pulses and the counting of increments of the signals.

Figure 2:
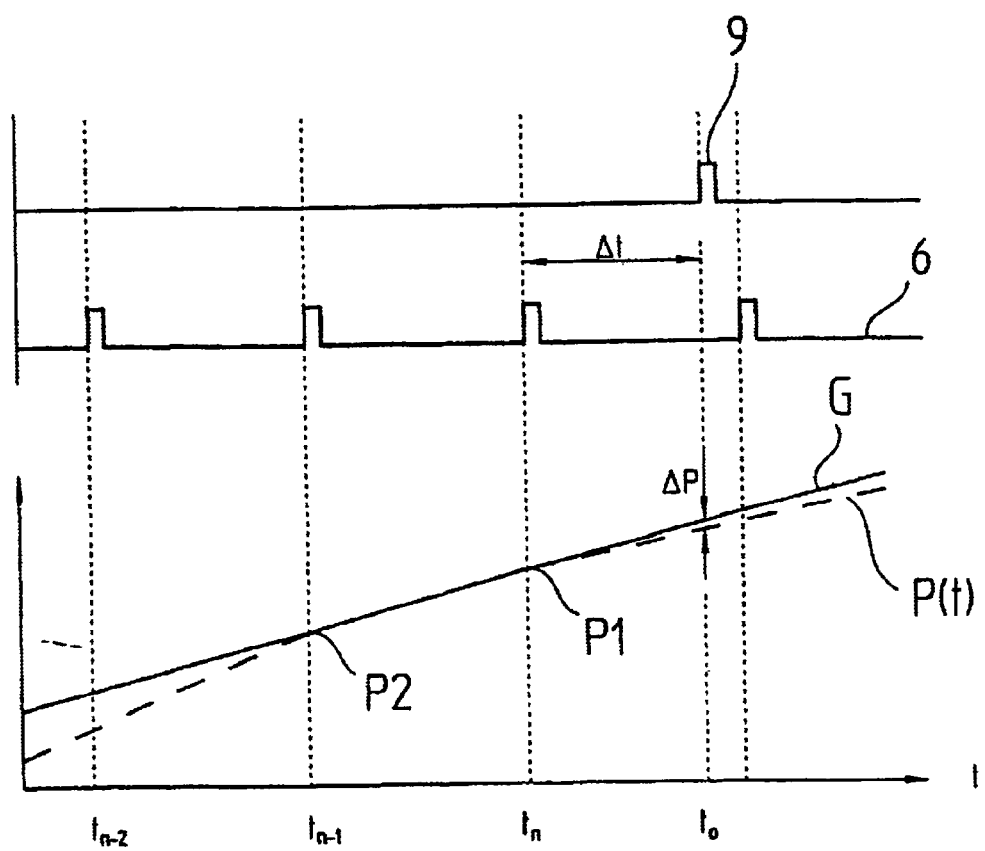
FIG. 2 shows a diagram showing a possible chronological sequence of the position determination performed by the position measuring device of FIG. 1 in accordance with the present invention.

The positional values obtained in this way are then passed on to an extrapolation unit 5. Reference is made to FIG. 2 in regard to the further course of the position measurement.

If now the position measuring device 1 receives a request (trigger signal 9) for a position measurement from a higher control unit 8, the period of time Δt from the last pulse of the internal cycle at tn until the arrival of the trigger signal 9 at the time t0 is determined in a timer 7. The timer 7 can be a time-to-digital converter (TDC), for example, which is set to 0 by the internal clock 6 and internally measures a period of time Δt very exactly, which is digitally output after the receipt of the trigger signal 9.

This period of time Δt is also sent to the extrapolation unit 5. An extrapolation for the position at the time t0 is performed there by a function which is approximated to at least the two position values P1 and P2 detected at the times tn and tn−1. This has advantages: with an object at rest, a linear extrapolation with two position values results in the mean of the position, and therefore a lowering of the noise. For an object moved at a constant speed the extrapolation is still very accurate. For obtaining advantages in regard to noise reduction it is necessary to extrapolate a straight line by three support points. For accelerated systems it is necessary to fall back on higher order functions (for example polynomials) in order to still obtain accurate extrapolations. However, if the maximally occurring accelerations are known, a limitation to linear extrapolation is possible if the error occurring because of this remains sufficiently small. For this purpose, the actual position course P(t) of an object being accelerated in one direction is shown in FIG. 2, together with the two positional values P1 and P2 detected at the times tn and tn−1. ΔP shows the error in a position calculation with linear extrapolation of a straight line G through P1 and P2. In the described case of application, accelerations of the mask table up to 10g must be expected, therefore, with an internal clock 6 of 1 MHz, a maximum extrapolation error ΔP of 0.05 nm results for Δt =1 μs. Based on the above extrapolation process, it is apparent that more position values are determined at previous time tn, tn−1 . . . and are employed than mathematically necessary.

The positional value determined in this way therefore is an approximation of the required positional value of the moved object at the time t0. It is transmitted from the position measuring device 1 to the higher control unit.

For optimally utilizing the advantages of noise suppression by taking the mean, on the one hand, and the exact determination of the position at the time t0, on the other hand, it would also be conceivable to match the extrapolation flexibly to the respective situation. Thus, a linear extrapolation with many points can take place in case of a slightly accelerated movable object, and a large noise suppression can be achieved in this way, but with greatly and not constantly accelerated objects a fall-back to an extrapolation of higher order can take place for keeping the deviation ΔP low.

It is a further advantage of this position measuring device that it is possible to take signal running times, which otherwise might falsify the measured result, into consideration. For example, light requires a definite time from a scale to the detector unit 2, the electronic follow-up devices in the detector unit 2, in the A/D converter 3 and in the processing unit 4 further contribute to delays in the measuring signal. These effects can be taken into consideration by an offset of the period of time Δt determined in the timer 7.

The present invention may be embodied in other forms than those specifically disclosed herein without departing from its spirit or essential characteristics. The described embodiments are to be considered in all respects only as illustrative and not restrictive, and the scope of the invention is commensurate with the appended claims rather than the foregoing description.

What is claimed is:

1. A position measuring device for determining a position of a movable object, comprising:
   a detector unit;
   an A/D converter connected to said detector unit, said A/D converter is controlled by an internal clock;
   a processing unit connected to said A/D converter;
   an extrapolation unit connected to said processing unit; and
   a timer connected to said extrapolation unit and said internal clock, said timer detects a period of time Δt between a pulse of said internal clock and an external trigger signal.

2. The position measuring device in accordance with claim 1, wherein said extrapolation unit extrapolates a position from at least two previously measured position data and said period of time Δt.

3. The position measuring device in accordance with claim 1, wherein said detector unit comprises a scanning head of an optical grating measuring system.

4. A method for position determination in a position measuring device, comprising:
   digitizing analog position data from a detector unit within time intervals of an internal clock rate;
   calculating position data from said digitized data;
   determining a period of time Δt between a pulse of said internal clock until an appearance of an external trigger signal, wherein said period of time Δt is measured by a timer;
   resetting said timer by said internal clock;
   outputting said period of time Δt elapsed since a last resetting of said timer and a receipt of said trigger signal by an extrapolation unit that performs said processing; and
   processing of at least two position data, together with said period of time Δt.

5. The method in accordance with claim 4, further comprising:
   extrapolating a positional value at a time of arrival of said external trigger signal by using a polynomial function.

6. The method in accordance with claim 5, further comprising:
   determining said polynomial function, wherein more position values are determined at previous times tn, tn−1, . . . and are employed than mathematically necessary; and
   obtaining a means for noise suppression.

7. A method for position determination in a position measuring device, comprising:
- digitizing analog position data from a detector unit within time intervals of an internal clock rate;
- calculating position data from said digitized data;
- determining a period of time Δt between a pulse of said internal clock until an appearance of an external trigger signal;
- processing of at least two position data, together with said period of time Δt; and
- extrapolating a positional value at a time of arrival of said external trigger signal by using a polynomial function.

8. The method in accordance with claim 7, further comprising:
- determining said polynomial function, wherein more position values are determined at previous times $t_n$, $t_{n-1}$, . . . and are employed than mathematically necessary; and
- obtaining a mean for noise suppression.

* * * * *